US012565704B2

(12) United States Patent
Shrivastava et al.

(10) Patent No.: US 12,565,704 B2
(45) Date of Patent: Mar. 3, 2026

(54) BIMETALLIC FACEPLATE FOR SUBSTRATE PROCESSING

(71) Applicant: Applied Materials, Inc., Santa Clara, CA (US)

(72) Inventors: Gaurav Shrivastava, Bengaluru (IN); Pavankumar Ramanand Harapanhalli, Bangalore (IN); Sudhir R. Gondhalekar, Fremont, CA (US); Yao-Hung Yang, Santa Clara, CA (US); Chih-Yang Chang, Santa Clara, CA (US)

(73) Assignee: Applied Materials Inc., Santa Clara, CA (US)

( * ) Notice: Subject to any disclaimer, the term of this patent is extended or adjusted under 35 U.S.C. 154(b) by 609 days.

(21) Appl. No.: 17/964,260

(22) Filed: Oct. 12, 2022

(65) Prior Publication Data

US 2024/0124980 A1 Apr. 18, 2024

(51) Int. Cl.
*C23C 16/455* (2006.01)

(52) U.S. Cl.
CPC .............................. *C23C 16/45563* (2013.01)

(58) Field of Classification Search
CPC ......... C23C 16/45563; C23C 16/45561; H01J 37/3244; H01J 37/32449
USPC ........................ 118/715; 156/345.33, 345.34
See application file for complete search history.

(56) References Cited

U.S. PATENT DOCUMENTS 6,079,356 A * 6/2000 Umotoy ............ H01J 37/32449
                                                         118/728

6,106,625 A * 8/2000 Koai ...................... C23C 16/455
                                                         118/724
6,905,079 B2 * 6/2005 Kuwada ............ C23C 16/45572
                                                         239/128
10,373,810 B2 * 8/2019 Noorbakhsh ..... H01J 37/32082
10,400,333 B2 9/2019 Sabri et al.
11,242,600 B2 2/2022 Bansal et al.
11,332,828 B2 * 5/2022 Griffin .............. C23C 16/45565
2003/0132319 A1 7/2003 Hytros et al.
2004/0243043 A1 12/2004 McCarthy et al.

(Continued)

FOREIGN PATENT DOCUMENTS

CN           111383892 A       7/2020
KR     10-2021-0105139 A       8/2021

OTHER PUBLICATIONS

Matweb.com (Year: 2025).*
International Search Report for PCT/US2023/032461, dated Dec. 28, 2023.

*Primary Examiner* — Rudy Zervigon
(74) *Attorney, Agent, or Firm* — Moser Taboada

(57) ABSTRACT

A bimetallic faceplate for substrate processing is provided including a plate having a plurality of gas distribution holes and formed of a first metal having a first coefficient of thermal expansion, the plate having at least one groove around a center of the plate and spaced from the center of the plate; and a metallic element disposed in the at least one groove and fixed to the plate in the at least one groove, the metallic element having a second coefficient of thermal expansion different from the first coefficient of thermal expansion, the metallic element being symmetrically arranged on or in the plate. A chamber for substrate processing is provided that includes a bimetallic faceplate. Also, a method of making a bimetallic faceplate is provided.

18 Claims, 2 Drawing Sheets

(56) References Cited

U.S. PATENT DOCUMENTS

| | | | |
|---|---|---|---|
| 2006/0137607 A1* | 6/2006 | Seo | H01J 37/3244 |
| | | | 257/E21.295 |
| 2012/0222815 A1* | 9/2012 | Sabri | C23C 16/45565 |
| | | | 239/436 |
| 2017/0101713 A1* | 4/2017 | Wang | C23C 16/45565 |
| 2018/0182598 A1 | 6/2018 | Kim | |
| 2019/0032211 A1* | 1/2019 | Tucker | H01L 21/4807 |
| 2022/0008946 A1 | 1/2022 | Yang et al. | |

* cited by examiner

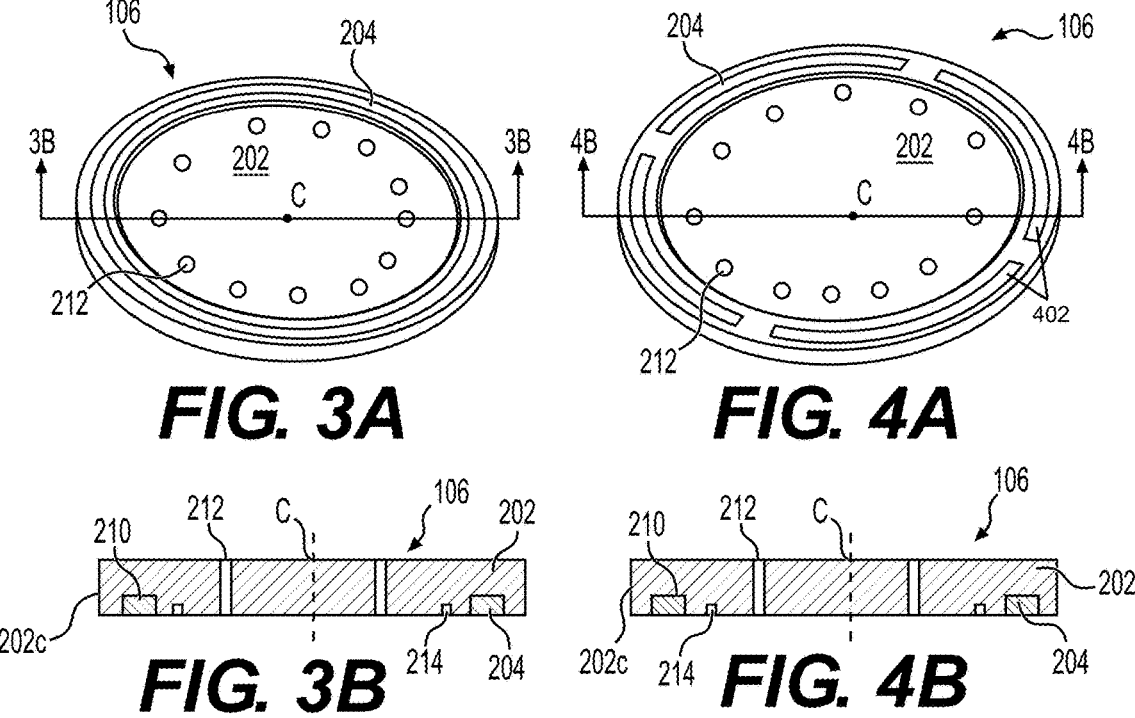
FIG. 3A
FIG. 4A
FIG. 3B
FIG. 4B
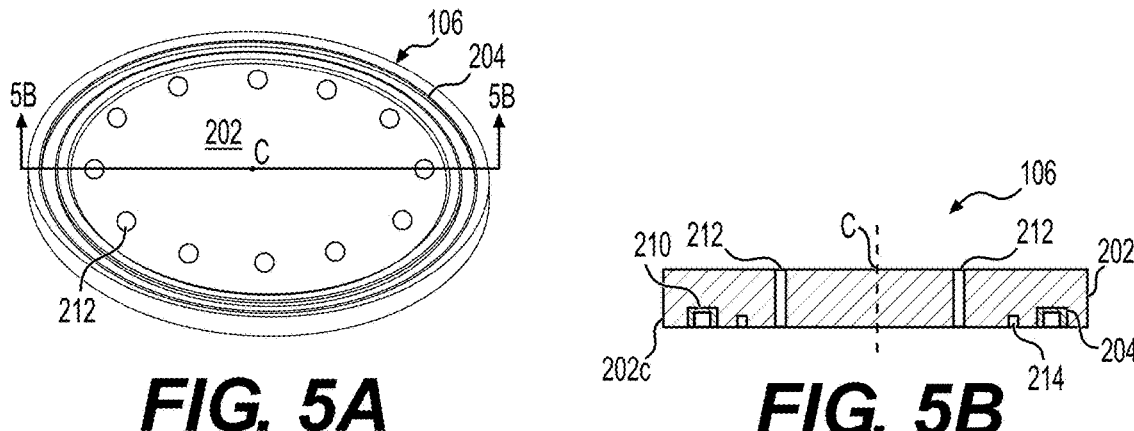
FIG. 5A
FIG. 5B

BIMETALLIC FACEPLATE FOR SUBSTRATE PROCESSING

FIELD

Embodiments of the present disclosure generally relate to faceplates for use in substrate processing chambers and, more particularly, to faceplates that are resistant to warpage.

BACKGROUND

Faceplates are often used in a processing chamber for dielectric deposition to evenly distribute process chemicals on a substrate surface. Under process conditions such faceplates may be heated in the range of 200° C.-400° C. and may experience a mechanical load from of other components in the processing chamber, such as a blocker plate and a gas box. Also, such faceplates may experience a pressure differential between an interior of the chamber and atmospheric pressure outside the chamber.

Under the afore-mentioned process conditions, some faceplates may permanently deform (referred to herein as "droop") downward between a center of the faceplate and an edge of the faceplate. Such droop can cause non-uniformity in the distribution of process chemicals on the substrate surface resulting in film edge thickness profile non-uniformities. When droop is observed, the faceplate is replaced. However, such replacement can increase maintenance and lower productivity.

Thus, as described in greater detail herein, the inventors provide a novel faceplate that can resist or eliminate droop.

SUMMARY

Methods and apparatus for substrate processing are provided herein. In some embodiments, a bimetallic faceplate for substrate processing includes a plate having a plurality of gas distribution holes and formed of a first metal having a first coefficient of thermal expansion, the plate having at least one groove around a center of the plate and spaced from the center of the plate; and a metallic element disposed in the at least one groove and fixed to the plate in the at least one groove, the metallic element having a second coefficient of thermal expansion different from the first coefficient of thermal expansion, the metallic element being symmetrically arranged on or in the plate.

In some embodiments, a processing chamber for substrate processing includes: a chamber body defining an interior cavity; and a bimetallic faceplate in communication with the interior cavity and coupled to the chamber body, the bimetallic faceplate comprising: a plate having a plurality of gas distribution holes and formed of a first metal having a first coefficient of thermal expansion, the plate having at least one groove around a center of the plate and spaced from the center of the plate; and a metallic element disposed in the at least one groove and fixed to the plate in the at least one groove, the metallic element having a second coefficient of thermal expansion different from the first coefficient of thermal expansion, the metallic element being symmetrically arranged on or in the plate.

In some embodiments, a method of making a bimetallic faceplate for substrate processing includes providing a plate formed of a first metal having a first coefficient of thermal expansion, the plate having a plurality of gas distribution holes and having at least one groove around a center of the plate and spaced from the center of the plate; and inserting a metallic element into the at least one groove; fixing the metallic element to the plate in the at least one groove, the metallic element having a second coefficient of thermal expansion different from the first coefficient of thermal expansion, wherein the metallic element is symmetrically arranged in the groove.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 3A is a bottom view of a bimetallic faceplate in accordance with embodiments of the present disclosure.

FIG. 3B is a section view of the bimetallic faceplate of FIG. 3A along section 3B-3B in FIG. 3A.

FIG. 4A is a bottom view of a bimetallic faceplate in accordance with embodiments of the present disclosure.

FIG. 4B is a section view of the bimetallic faceplate of FIG. 4A along section 4B-4B in FIG. 4A.

FIG. 5A is a bottom view of a bimetallic faceplate in accordance with embodiments of the present disclosure.

FIG. 5B is a partial section view of the bimetallic faceplate of FIG. 5A along section 5B-5B in FIG. 5A.

Figure 1:
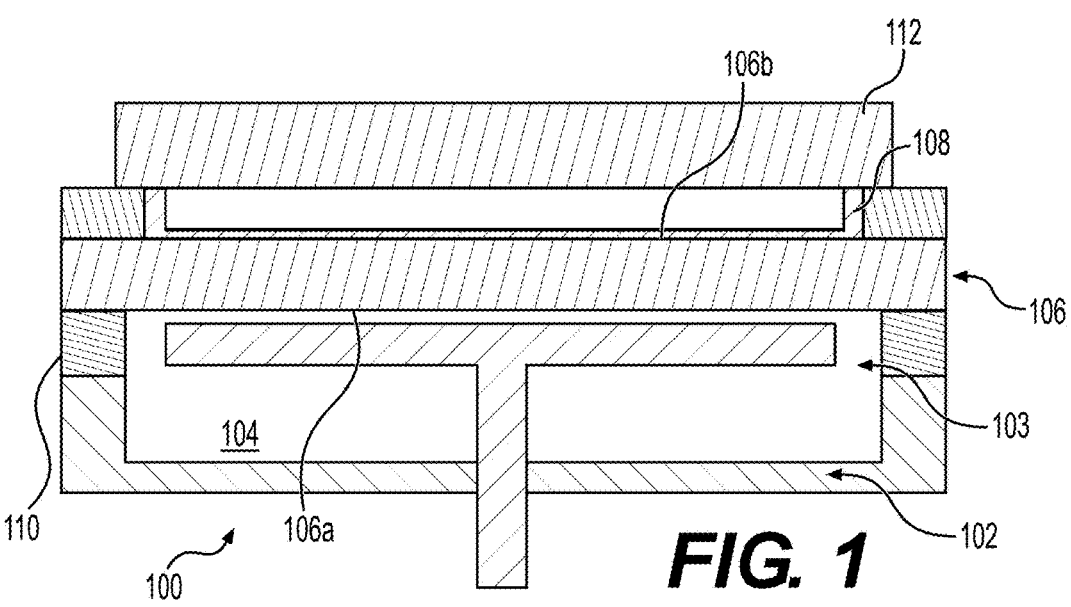
FIG. 1 is a section view of a processing chamber for substrate processing in accordance with embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a bimetallic faceplate and related processing chamber and method of making are provided herein. The embodiments of the bimetallic faceplate described herein are configured to resist droop and, thus, mitigate or avoid the above-noted increased maintenance and lower productivity.

FIG. 1 is a cross-section view of a processing chamber 100 for substrate processing in accordance with embodiments of the present disclosure. Such substrate processing may include dielectric deposition to uniformly distribute process chemicals on a substrate surface. The processing chamber 100 may include a chamber body 102 defining an interior cavity 104 and housing a substrate support 103 for supporting a substrate (not shown). A bimetallic faceplate 106 may be coupled to the chamber body 102, for example along a top of the chamber body 102 as shown in FIG. 1. In some embodiments, the bimetallic faceplate 106 may form part of a lid of the processing chamber 100 separating the interior cavity 104 from atmosphere. In some embodiments, and as shown in FIG. 1, the bimetallic faceplate 106 may have a lower surface 106a and an upper surface 106b, with the lower surface 106a being in communication with the interior cavity 104. In some embodiments, the lower surface 106a of the bimetallic faceplate 106 is sealed with the chamber body 102 and/or the ceramic insulator 110, such as with an o-ring seal. In some embodiments the bimetallic faceplate 106 may be connected to one or more other components outside of the interior cavity 104, such as a blocker plate 108 and/or a ceramic insulator 110. In some embodiments, and as shown in FIG. 1, a gas box 112 may be disposed above and connect to the blocker plate 108.

In use in the interior cavity 104 of the processing chamber 100, during substrate processing, the bimetallic faceplate 106 may be heated in the range of 200° C. to 400° C. and may experience a mechanical load from other components, such as the blocker plate 108 and the gas box 112, as well as from a pressure difference between the interior cavity 104 and atmosphere outside the chamber body 102. Such conditions thus exert forces on the bimetallic faceplate 106, which left unopposed, could cause droop. As described in greater detail below, embodiments of the bimetallic faceplate 106 described herein are configured to generate forces to counteract and cancel forces tending to cause droop so that the bimetallic faceplate 106 can remain flat during substrate processing.

Figure 2:
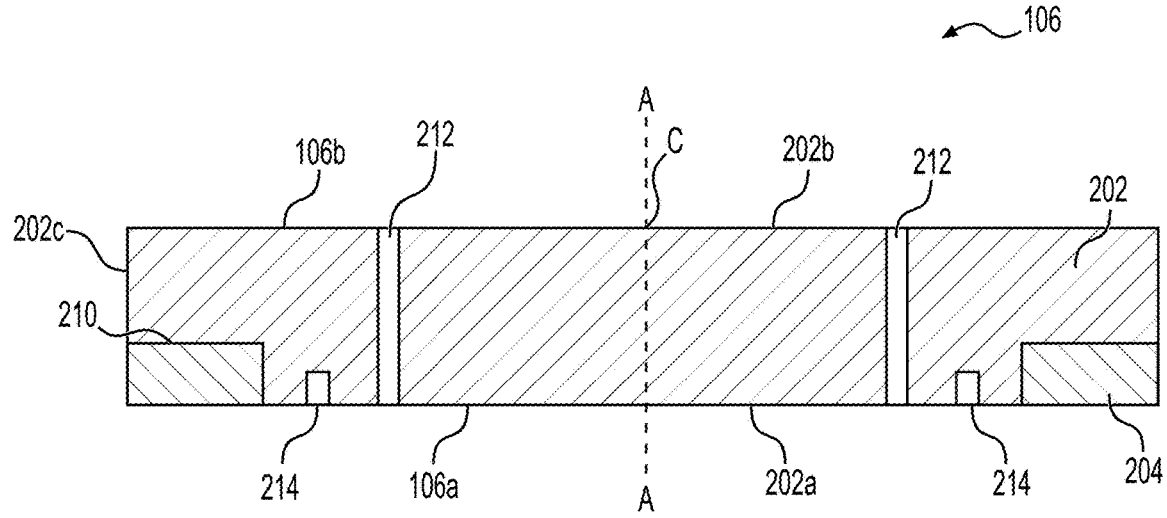
FIG. 2 is a section view of a bimetallic faceplate in accordance with embodiments of the present disclosure.

In some embodiments, and as shown in FIG. 2, the bimetallic faceplate 106 may include a plate 202 and a metallic element 204. The bimetallic faceplate 106 in FIG. 2 has an upper surface 106b and lower surface 106a that may be parallel with the upper surface 106b. In some embodiments, the plate 202 may be formed from a first metal having a first coefficient of thermal expansion. In some embodiments the plate includes at least one of aluminum, titanium, stainless steel, or tungsten, or alloys thereof.

Also, in some embodiments, and as shown in FIG. 2, the plate 202 may have at least one groove 210 that extends around and is spaced from a center of the plate (represented in FIG. 2 as being located along central axis A-A). In some embodiments, the plate may have a plurality of gas distribution holes 212 and an o-ring groove 214. The o-ring groove 214 may be configured to receive an o-ring seal configured to seal with one or more other components of the processing chamber 100, such as the blocker plate 108 or ceramic insulator 110, for example.

In some embodiments, and as shown in FIG. 2, the metallic element 204 may be disposed in the at least one groove 210 and fixed to the plate 202 in the at least one groove 210. The metallic element 204 may be fixed to the plate 202 by various methods, including fastening, swaging, or welding. The metallic element 204 has a second coefficient of thermal expansion different from the first coefficient of thermal expansion and the metallic element 204 is symmetrically arranged on or in the plate 202. In some embodiments, the metallic element includes at least one of titanium, stainless steel, or tungsten, or alloys thereof.

In some embodiments, and as shown in FIGS. 2-5B the metallic element 204 may be formed as a ring centered around the center C of the plate 202, which may be circular. In some embodiments, and as shown in FIGS. 3A and 5A, such ring may be formed as a single continuous member. In some embodiments, and as shown in FIG. 4A, such ring may be formed as a plurality of separately spaced apart members 402 (e.g., arcuate members), which may be circumferentially spaced equidistantly. It will be appreciated, however, that in some embodiments, the metallic element 204 shown in FIG. 5A may be formed as a plurality of separately spaced apart members (e.g., arcuate members) like members 402 shown in FIG. 4A.

In some embodiments, and as shown in FIGS. 2, 3B, and 4B, the metallic element 204 may have a solid cross section.

In some embodiments, and as shown in FIG. 5B, the metallic element 204 may have an open or channel cross section, such as a u-channel.

In some embodiments, the metallic element 204 may be at least partially embedded in the plate. In some embodiments, and as shown in FIGS. 2B, 3B, 4B, and 5B, the metallic element 204 may extend flush with a lower surface 202a the plate 202. In some other embodiments (not shown), the metallic element 204 may be flush with an upper surface 202b of the plate 202.

The distance between the center C and the metallic element 204 may vary. For example, in some embodiments, and as shown in FIG. 2, the metallic element 204 extends flush with a peripheral edge 202c of the plate 202. In some embodiments, and as shown in FIGS. 3A-5B, the metallic element 204 may be spaced inwardly (with respect to the center C) from the peripheral edge 202c.

In some embodiments, and as shown in FIGS. 2, 3B, 4B, and 5B, the groove 210 may be formed in the lower surface 202a of the plate 202. In such embodiments, the second coefficient of thermal expansion of the metallic element 204 may be less than the first coefficient of thermal expansion of the plate 202. Thus, when the bimetallic faceplate 106 is heated, due in part to the difference in the first and second coefficients of thermal expansion and the symmetric arrangement of the metallic element 204, the metallic element 204 can exert an inwardly directed (i.e., radially toward the center C) hoop force on the plate 202 which can cause an antidroop effect to counteract forces tending to cause droop, thereby maintaining the bimetallic faceplate 106 relatively flat when subject to process conditions. In some embodiments where the groove 210 is formed in the upper surface 202b of the plate 202 and the metallic element 204 is in the groove 210, the second coefficient of thermal expansion of the metallic element 204 may be greater than the first coefficient of thermal expansion of the plate 202 to counter the effect of droop.

While the foregoing is directed to embodiments of the present disclosure, other and further embodiments of the disclosure may be devised without departing from the basic scope thereof.

The invention claimed is:

1. A bimetallic faceplate for substrate processing, comprising: a metal plate having a plurality of gas distribution holes and formed of a first metal having a first coefficient of thermal expansion, the metal plate having at least one groove around a center of the metal plate and spaced from the center of the metal plate; and a metallic element disposed in the at least one groove and fixed to the metal plate in the at least one groove, the metallic element having a second coefficient of thermal expansion different from the first coefficient of thermal expansion, the metallic element being symmetrically arranged on or in the metal plate, wherein the metallic element extends to an upper surface or a lower surface of the metal plate, wherein the metallic element has an outer diameter no larger than the outer diameter of the metal plate.

2. The bimetallic faceplate of claim 1, wherein the metallic element includes a ring, wherein the ring has a solid cross section or a channel cross section.

3. The bimetallic faceplate of claim 1, wherein the metal plate has an o-ring groove.

4. The bimetallic faceplate of claim 1, wherein the metallic element includes a plurality of arcuate members spaced equally circumferentially from one another.

5. The bimetallic faceplate of claim 1, wherein the groove is formed in the upper surface of the metal plate or the lower surface of the metal plate.

6. The bimetallic faceplate of claim 5, wherein the metallic element is disposed in a groove formed in the lower surface of the metal plate and the second coefficient of thermal expansion is less than the first coefficient of thermal expansion.

7. The bimetallic faceplate of claim 1, wherein the metal plate includes aluminum.

8. The bimetallic faceplate of claim 1, wherein the metallic element includes at least one of titanium, stainless steel, or tungsten.

9. A processing chamber for substrate processing, comprising: a chamber body defining an interior cavity; and a bimetallic faceplate in communication with the interior cavity and coupled to the chamber body, the bimetallic faceplate comprising: a metal plate having a plurality of gas distribution holes and formed of a first metal having a first coefficient of thermal expansion, the metal plate having at least one groove around a center of the metal plate and spaced from the center of the metal plate; and a metallic element disposed in the at least one groove and fixed to the metal plate in the at least one groove, the metallic element having a second coefficient of thermal expansion different from the first coefficient of thermal expansion, the metallic element being symmetrically arranged on or in the metal plate, wherein the metallic element extends to an upper surface or a lower surface of the metal plate, wherein the metallic element has an outer diameter no larger than the outer diameter of the metal plate.

10. The processing chamber of claim 9, wherein the metallic element includes a ring, wherein the ring has a solid cross section or a channel cross section.

11. The processing chamber of claim 9, wherein the metal plate has an o-ring groove.

12. The processing chamber of claim 9, wherein the metallic element includes a plurality of arcuate members spaced equally circumferentially from one another.

13. The processing chamber of claim 9, wherein the metallic element is flush with the upper surface of the metal plate or the lower surface of the metal plate.

14. The processing chamber of claim 9, wherein the metallic element is disposed in a groove formed in the lower surface of the metal plate and the second coefficient of thermal expansion is less than the first coefficient of thermal expansion.

15. The processing chamber of claim 9, wherein the metal plate includes aluminum.

16. The processing chamber of claim 9, wherein the metallic element includes at least one of titanium, stainless steel, or tungsten.

17. A method of making a bimetallic faceplate for substrate processing, comprising: providing a metal plate having a plurality of gas distribution holes and formed of a first metal having a first coefficient of thermal expansion, the metal plate having at least one groove around a center of the metal plate and spaced from the center of the metal plate; inserting a metallic element into the at least one groove; and fixing the metallic element to the metal plate in the at least one groove, the metallic element having a second coefficient of thermal expansion different from the first coefficient of thermal expansion, wherein the metallic element is symmetrically arranged in the groove, wherein the metallic element extends to an upper surface or a lower surface of the metal plate, wherein the metallic element has an outer diameter no larger than the outer diameter of the metal plate.

18. The method of claim 17, wherein the metallic element includes a ring or a plurality of arcuate members equally spaced circumferentially from one another.

* * * * *